(12) United States Patent
Graff et al.

(10) Patent No.: US 6,522,067 B1
(45) Date of Patent: Feb. 18, 2003

(54) ENVIRONMENTAL BARRIER MATERIAL FOR ORGANIC LIGHT EMITTING DEVICE AND METHOD OF MAKING

(75) Inventors: Gordon L. Graff, West Richland, WA (US); Mark E. Gross, Pasco, WA (US); John D. Affinito, Kennewick, WA (US); Ming-Kun Shi, Richland, WA (US); Michael Hall, West Richland, WA (US); Eric Mast, Richland, WA (US)

(73) Assignee: Battelle Memorial Institute, Richland, WA (US)

( * ) Notice: Subject to any disclaimer, the term of this patent is extended or adjusted under 35 U.S.C. 154(b) by 0 days.

(21) Appl. No.: 09/427,138

(22) Filed: Oct. 25, 1999

Related U.S. Application Data

(63) Continuation-in-part of application No. 09/212,779, filed on Dec. 16, 1998, now Pat. No. 6,268,695.

(51) Int. Cl.⁷ .............................................. H05B 33/00
(52) U.S. Cl. ..................... 313/512; 313/504; 313/506; 428/690
(58) Field of Search ................. 313/506, 504, 313/512, 509, 503; 428/690

(56) References Cited

U.S. PATENT DOCUMENTS

| | | | |
|---|---|---|---|
| 3,607,365 A | 9/1971 | Lindlof | |
| 4,098,965 A | 7/1978 | Kinsman | |
| 4,283,482 A | 8/1981 | Hattori et al. | |

(List continued on next page.)

FOREIGN PATENT DOCUMENTS

| | | |
|---|---|---|
| BE | 704 297 | 2/1968 |
| DE | 19603746 | 4/1997 |
| EP | 0299753 | 1/1989 |
| EP | 0 299 753 | 1/1989 |

(List continued on next page.)

OTHER PUBLICATIONS

Affinito, J.D. et al., "High rate vacuum deposition of polymer electrolytes" Journal Vacuum Science Technology A 14(3), May/Jun. 1996, pp. 733–738.

Affinito, J.D. et al., "Vacuum Deposition Of Polymer Electrolytes On Flexible Substrates" Proceedings of the Ninth International Conference on Vacuum Web Coating, Nov. 1995, ed R. Bakish, Bakish Press 1995, pp. 20–36.

Penning, F.M. et al., "Electrical Discharges in Gases" Gordon and Breach Science Publishers, 1965, Chapters 5–6, pp. 19–35; and Chapter 8, pp. 41–50.

Inoue et al., "Fabrication of a Thin Film of MNA by Vapour Deposition", Proc. Jpn. Congr. Mater. Res., vol. 33, 1990, pp. 177–179.

Vossen, J.L. et al., editors, "Thin Film Processes" Acadamic Press, 1978, Part II, Chapter II–1, Glow Discharge Sputter Deposition, pp. 12–63; Part IV, Chapter IV–1, Plasma Deposition of Inorganic Thin Films, pp. 335–360 and Chapter IV–2, Glow Discharge Polymerization, pp. 361–397.

(List continued on next page.)

*Primary Examiner*—Vip Patel
*Assistant Examiner*—Joseph Williams
(74) *Attorney, Agent, or Firm*—Killworth, Gottman, Hagan & Schaeff, L.L.P.

(57) ABSTRACT

An encapsulated organic light emitting device. The device includes a first barrier stack comprising at least one first barrier layer and at least one first polymer layer. There is an organic light emitting layer stack adjacent to the first barrier stack. A second barrier stack is adjacent to the organic light emitting layer stack. The second barrier stack has at least one second barrier layer and at least one second polymer layer. A method of making the encapsulated organic light emitting device is also provided.

57 Claims, 1 Drawing Sheet

U.S. PATENT DOCUMENTS

| | | |
|---|---|---|
| 4,581,337 A | 4/1986 | Frey et al. |
| 4,624,867 A | 11/1986 | Iijima et al. |
| 4,695,618 A | 9/1987 | Mowrer |
| 4,842,893 A | 6/1989 | Yializis et al. |
| 4,954,371 A | 9/1990 | Yializis |
| 5,032,461 A | 7/1991 | Shaw et al. |
| 5,036,249 A | 7/1991 | Pike-Biegunski et al. |
| 5,124,204 A | 6/1992 | Yamashita et al. |
| 5,189,405 A | 2/1993 | Yamashita et al. |
| 5,237,439 A | 8/1993 | Misono et al. |
| 5,260,095 A | 11/1993 | Affinito |
| 5,354,497 A | 10/1994 | Fukuchi et al. |
| 5,395,644 A | 3/1995 | Affinito |
| 5,427,638 A | 6/1995 | Goetz et al. |
| 5,440,446 A | 8/1995 | Shaw et al. |
| 5,536,323 A | 7/1996 | Kinlin et al. |
| 5,547,508 A | 8/1996 | Affinito |
| 5,554,220 A | 9/1996 | Forrest et al. |
| 5,576,101 A | 11/1996 | Saitoh et al. |
| 5,607,789 A | 3/1997 | Treger et al. |
| 5,620,524 A | 4/1997 | Fan et al. |
| 5,629,389 A | 5/1997 | Roitman et al. |
| 5,654,084 A | 8/1997 | Egert |
| 5,681,615 A | 10/1997 | Affinito et al. |
| 5,681,666 A | 10/1997 | Treger et al. |
| 5,684,084 A | 11/1997 | Lewin et al. |
| 5,686,360 A | 11/1997 | Harvey, III et al. |
| 5,693,956 A | 12/1997 | Shi et al. |
| 5,711,816 A | 1/1998 | Kinlin et al. |
| 5,725,909 A | 3/1998 | Shaw et al. |
| 5,731,661 A | 3/1998 | So et al. |
| 5,747,182 A | 5/1998 | Friend et al. |
| 5,757,126 A | 5/1998 | Harvey, III et al. |
| 5,759,329 A | 6/1998 | Krause et al. |
| 5,771,562 A | 6/1998 | Harvey, III et al. |
| 5,792,550 A | 8/1998 | Phillips et al. |
| 5,811,177 A | 9/1998 | Shi et al. |
| 5,811,183 A | 9/1998 | Shaw et al. |
| 5,821,692 A | 10/1998 | Rogers et al. |
| 5,844,363 A | 12/1998 | Gu et al. |
| 5,872,355 A | 2/1999 | Hueschen |
| 5,902,641 A | 5/1999 | Affinito et al. |
| 5,902,688 A | 5/1999 | Antoniadis et al. |
| 5,904,958 A | 5/1999 | Dick et al. |
| 5,912,069 A | 6/1999 | Yializis et al. |
| 5,922,161 A | 7/1999 | Wu et al. |
| 5,945,174 A | 8/1999 | Shaw et al. |
| 5,948,552 A | 9/1999 | Antoniadis et al. |
| 5,952,778 A | 9/1999 | Haskal et al. |
| 3,475,307 A | 10/1999 | Knox et al. |
| 5,965,907 A | 10/1999 | Huang et al. |
| 5,996,498 A | 12/1999 | Lewis |
| 6,045,864 A | 4/2000 | Lyons et al. |
| 6,083,628 A | 7/2000 | Yializis |
| 6,146,225 A | 11/2000 | Sheats et al. |
| 6,198,217 B1 | 3/2001 | Suzuki et al. |

FOREIGN PATENT DOCUMENTS

| | | |
|---|---|---|
| EP | 0 340 935 | 11/1989 |
| EP | 0 547 550 | 6/1993 |
| EP | 0 590 467 | 4/1994 |
| EP | 0 390 540 | 8/1994 |
| EP | 0 722 787 | 7/1996 |
| EP | 0 787 826 | 8/1997 |
| EP | 0 916 394 | 5/1999 |
| EP | 0 931 850 | 7/1999 |
| EP | 0 977 469 A2 | 2/2000 |
| EP | 0 977 469 | 2/2000 |
| JP | 63 136316 | 6/1988 |
| JP | 64 18441 | 1/1989 |
| JP | 2 183230 | 7/1990 |
| JP | 08 325713 | 12/1996 |
| JP | 09 059763 | 3/1997 |
| WO | WO 87/07848 | 12/1987 |
| WO | WO 95/10117 | 4/1995 |
| WO | WO 97/04885 | 2/1997 |
| WO | WO 97/22631 | 6/1997 |
| WO | WO 98/10116 | 3/1998 |
| WO | WO 98/18852 | 5/1998 |
| WO | WO 99/16557 | 4/1999 |
| WO | WO 99/16931 | 4/1999 |

OTHER PUBLICATIONS

Affinito J D et al., "PML/oxide/PML barrier layer performance differences arising from use of UV or electron beam polymerization of the PML layers" Thin Solid Films, Elsevier Science S.A., vol. 308–309, Oct. 31, 1997, pp. 19–25.

Notification of Transmittal of the International Search Report or the Declaration, Mar. 3, 2000, PCT/US 99/29853.

G. Gustafsson et al., "Flexible light–emitting diodes made from soluble conducting polymers", Nature, vol. 357, Jun. 11, 1992, pp. 477–479.

J.D. Affinito et al., "Polymer–Oxide Transparent Barrier Layers", SVC 39th Annual Technical Conference, Vacuum Web Coating Session, 1996.

J.D. Affinito et al., "PML/Oxide/PML Barrier Layer Performance Differences Arising from Use of UV or Electron Beam Polymerization of the PML Layers", SVC 40th Annual Technical Conference, 1997.

ENVIRONMENTAL BARRIER MATERIAL FOR ORGANIC LIGHT EMITTING DEVICE AND METHOD OF MAKING

This application is a continuation-in-part of U.S. patent application Ser. No. 09/212,779, filed Dec. 16, 1998 entitled "Environmental Barrier Material for Organic Light Emitting Device and Method of Making," now U.S. Pat. No. 6,268,695.

BACKGROUND OF THE INVENTION

The present invention relates to organic light emitting devices (OLEDs), and more particularly to OLEDs encapsulated in barrier stacks.

There is a need for versatile visual displays for electronic products of many different types. Light emitting diodes (LEDs) and liquid crystal displays (LCDs) have found many useful applications, but they are not adequate for all situations. OLEDs are a relatively new type of visual display which has shown great promise. An OLED basically includes an organic electroluminescent substance placed between two electrodes. When an electric potential is applied across the electrodes, the electroluminescent substance emits visible light. Typically, one of the electrodes is transparent, allowing the light to shine through. U.S. Pat. No. 5,629,389 (Roitman et al.), U.S. Pat. No. 5,747,182 (Friend et al.), U.S. Pat. No. 5,844,363 (Gu et al.), U.S. Pat. No. 5,872,355 (Hueschen), U.S. Pat. No. 5,902,688 (Antoniadis et al.), and U.S. Pat. No. 5,948,552 (Antoniadis et al.), which are incorporated herein by reference, disclose various OLED structures.

The use of OLEDs in flat panel displays and other information display formats is limited by the poor environmental stability of the devices. G.Gustafson, Y.Cao, G. M. Treacy, F. Klavetter, N. Colaneri, and A. J. Heeger, Nature, Vol. 35, Jun. 11, 1992, pages 477–479. Humidity and oxygen significantly reduce the useful life of most OLEDs. As a result, these devices are typically fabricated on glass substrates with glass covers laminated on top of the OLED and with the edges sealed to exclude water and oxygen from the active layers. U.S. Pat. No. 5,872,355 discloses the use of a polymer such as saran to seal the device. The water vapor permeation rates (WVTR) required to provide sufficient lifetime for OLEDs is calculated to be approximately $10^{-6}$ g/m$^2$/day. The best polymer films (such as saran) have WVTR values that are 5 orders of magnitude too high to be considered for OLED encapsulation. Furthermore, saran cannot be deposited using flash evaporation, condensation, and in situ polymerization within a vacuum chamber.

Thus, there is a need for an improved lightweight, barrier construction which can be used to encapsulate the OLED and prevent the deterioration caused by permeation of oxygen and water vapor and for a method of making such an encapsulated OLED.

SUMMARY OF THE INVENTION

These needs are met by the present invention which is an encapsulated organic light emitting device (OLED). The device includes a first barrier stack comprising at least one first barrier layer and at least one first polymer layer. There is an organic light emitting layer stack adjacent to the first barrier stack. A second barrier stack is adjacent to the organic light emitting layer stack. The second barrier stack has at least one second barrier layer and at least one second polymer layer. The device optionally includes at least one first intermediate barrier stack located between the substrate and the first barrier stack, and/or at least one second intermediate barrier stack located between the organic light emitting layer stack and either the first or second barrier stacks. The first and second intermediate barrier stacks include at least one polymer layer and at least one barrier layer.

Preferably, either one or both of the first and second barrier layers of the first and second barrier stacks is substantially transparent. At least one of the. first and second barrier layers preferably comprises a material selected from metal oxides, metal nitrides, metal carbides, metal oxynitrides, and combinations thereof. The metal oxides are preferably selected from silica, alumina, titania, indium oxide, tin oxide, indium tin oxide, and combinations thereof, the metal nitrides are preferably selected from aluminum nitride, silicon nitride, and combinations thereof, the metal carbide is preferably silicon carbide, and the metal oxynitride is preferably silicon oxynitride.

The encapsulated OLED can also include a substrate adjacent to the first barrier stack on a side opposite to the organic light emitting layer stack. The substrate can be either a flexible substrate or a rigid substrate. It is preferably a flexible substrate material, which can be polymers, metals, paper, fabric, and combinations thereof. The rigid substrate is preferably glass, metal, or silicon. If a rigid substrate is used, it can be removed prior to use if desired.

The polymer layers of the first and second barrier stacks and the polymer layers in the first and second intermediate barrier stacks are preferably acrylate-containing polymers (as used herein, the term acrylate-containing polymer includes acrylate-containing polymers, methacrylate-containing polymers, and combinations thereof). The polymer layers in the first and/or the second barrier stacks can be the same or different.

The organic light emitting layer stack preferably comprises a first electrode, an electroluminescent layer, and a second electrode. The electroluminescent layer preferably includes a hole transporting layer, and an electron transporting layer, as is known in the art and shown in the patents whose disclosures have been specifically incorporated herein.

The invention also involves a method of making the encapsulated organic light emitting device. The method includes forming a first barrier stack comprising at least one first barrier layer and at least one first polymer layer, forming an organic light emitting layer stack, forming a second barrier stack comprising at least one second barrier layer and at least one second polymer layer, and combining the first barrier stack, the organic light emitting layer stack, and the second barrier stack to form the encapsulated organic light emitting device. Intermediate barrier stacks can optionally be formed. The layers are preferably formed by vacuum deposition.

The organic light emitting layer stack can be combined with the first barrier stack and/or the second barrier stack by laminating them together. Alternatively, they can be combined simultaneously with forming by depositing one layer on the other.

In an alternative embodiment, the invention involves an encapsulated organic light. emitting device having a substrate, an organic light emitting layer stack adjacent to the substrate, and a barrier stack comprising at least one barrier layer and at least one polymer layer, the barrier stack adjacent to the organic light emitting layer stack. The invention also involves methods of making the encapsulated organic light emitting device. One method includes providing a substrate having an organic light emitting layer stack thereon, and laminating a barrier stack comprising at least one barrier layer and at least one polymer layer over the organic light emitting layer stack to encapsulate the organic light emitting barrier layer stack. The barrier stack is preferably laminated (edge sealed) using an adhesive, but other methods can be used including heat.

Another method involves vacuum depositing the barrier stack on a substrate having an organic light emitting layer stack thereon. Still another method involves providing a substrate with an organic light emitting layer stack thereon, vacuum depositing at least one barrier layer on the organic light emitting layer stack, and depositing at least one first polymer layer on the at least one barrier layer. At least one second polymer layer can be deposited on the organic light emitting layer stack before the barrier layer is deposited.

Accordingly, it is an object of the present invention to provide an encapsulated OLED, and to provide a method of making such a device..

DESCRIPTION OF THE INVENTION

Figure 1:
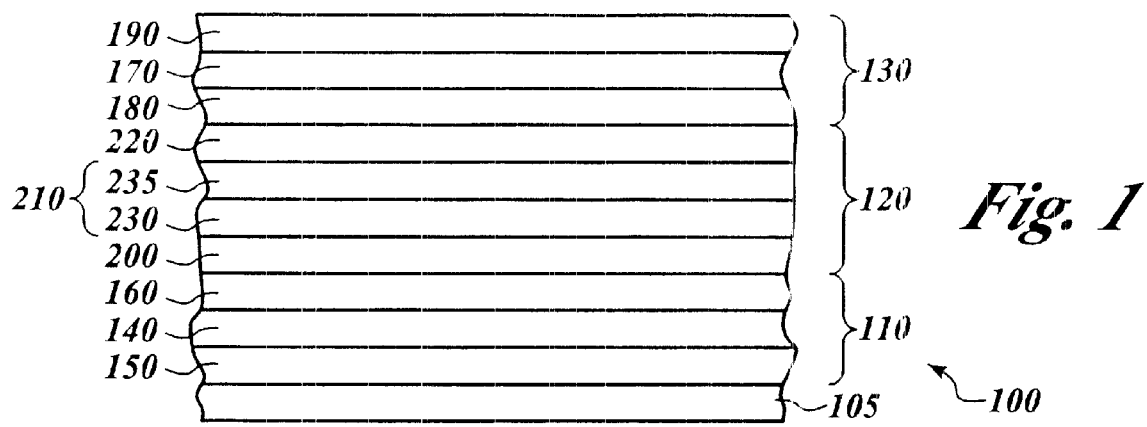
FIG. 1 is a cross-section of one embodiment of the encapsulated OLED of the present invention.

One embodiment of the present invention is an encapsulated OLED 100 as shown in FIG. 1. The encapsulated OLED 100 includes substrate 105, a first barrier stack 110, an organic light emitting layer stack 120, and a second barrier stack 130. The first barrier stack 110 has a first barrier layer 140 and two polymer layers 150, 160. The second encapsulation layer 130 includes a second barrier layer 170 and two polymer layers 180, 190.

Although the Figures show barrier stacks with a single polymer layer on both sides of a single barrier layer, the barrier stacks can have one or more polymer layers and one or more barrier layers. There could be one polymer layer and one barrier layer, there could be multiple polymer layers on one side of one or more barrier layers, or there could be one or more polymer layers on both sides of one or more barrier layers. The important feature is that the barrier stack have at least one polymer layer and at least one barrier layer.

The organic light emitting layer stack 120 includes a first electrode layer 200, an electroluminescent layer 210, and a second electrode 220. The electroluminescent layer 210 can include a hole transport layer 230, and an electron transport layer 235. The exact form and composition of the organic light emitting layer stack is not critical. The organic light emitting layer stack includes first and second electrode layers on opposite sides of one or more active layers. The electrode layers are connected to a power source. At least one of the electrodes is transparent. The electroluminescent layer may be multiple layers as shown, or a single layer. The electroluminescent layer typically includes a hole injection layer, a hole transport layer, an electron transport layer, and an emissive layer, and combinations thereof. Additional layers may also be present, including dielectric layers. The organic light emitting layer stack can be made using known techniques, such as those described in U.S. Pat. No. 5,629,389 (Roitman et al.), U.S. Pat. No. 5,844,363 (Gu et al.), U.S. Pat. No. 5,872,355 (Hueschen), U.S. Pat. No. 5,902, 688 (Antoniadis et al.), and U.S. Pat. No. 5,948,552 (Antoniadis et al.), which have been incorporated herein by reference.

The present invention is compatible with organic light emitting layer stacks made with light emitting polymers and small molecules.

Figure 2:
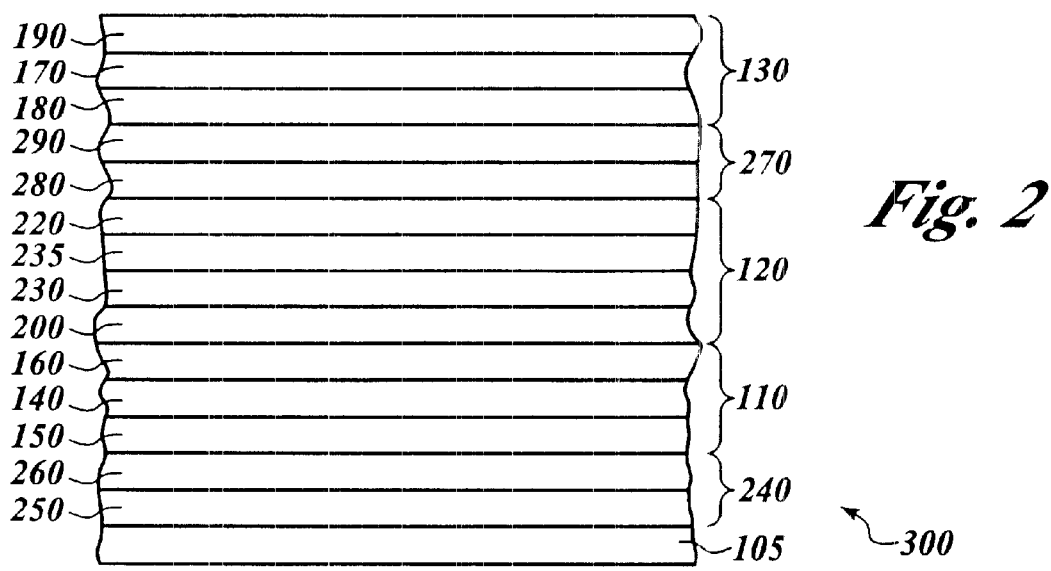
FIG. 2 is a cross-section of an alternate embodiment of the encapsulated OLED of the present invention.

In the alternate embodiment shown in FIG. 2, the encapsulated OLED 300 also includes a first intermediate barrier stack 240 and a second intermediate barrier stack 270. The first intermediate barrier stack is located between the substrate 105 and the first barrier stack 110, and it includes a polymer layer 250 and a barrier layer 260. The second intermediate barrier stack 270 includes a polymer layer 280 and a barrier layer 290. The second intermediate barrier stack 270 is located between the organic light emitting layer stack 120 and the second barrier stack 130. Alternatively, the second intermediate layer could be located between the first barrier layer and the organic light emitting layer stack. In addition, there could be multiple first intermediate barrier stacks on top of one another to provide enhanced barrier protection. Similarly, there could be multiple second intermediate barrier stacks on top of one another. The order of the barrier and polymer layers in the intermediate barrier stacks is not critical. It depends on where the intermediate barrier stack is located and what layers are next to them.

The encapsulated OLED can be made by forming the first barrier stack 110, the organic light emitting layer stack 120, and the second barrier stack 130. The stacks are combined to form the encapsulated OLED.

Preferably, the stacks are combined by forming them using vacuum deposition. In this method, one layer is vacuum deposited on the previous layer, thereby combining the layers simultaneously with forming them. Alternatively, the organic light emitting layer stack can be combined with the first and second barrier stacks by laminating it between the first and second barrier stacks and sealing it along the edges with adhesive, glue, or the like, or by heating. The first and second barrier stacks include at least one barrier layer and at least one polymer layer. If a polymer/barrier/polymer structure is desired, it can be preferably formed as follows. These barrier stacks can be formed by depositing a layer of polymer, for example an acrylate-containing polymer, onto a substrate or previous layer. Preferably, an acrylate-containing monomer, oligomer or resin (as used herein, the term acrylate-containing monomer, oligomer, or resin includes acrylate-containing monomers, oligomers, and resins, methacrylate-containing monomers, oligomers, and resins, and combinations thereof) is deposited and then polymerized in situ to form the polymer layer. The acrylate-containing polymer layer is then coated with a barrier layer. Another polymer layer is deposited onto the barrier layer. U.S. Pat. Nos. 5,440,446 and 5,725,909, which are incorporated herein by reference, describe methods of depositing thin film, barrier stacks.

The barrier stacks are preferably vacuum deposited. Vacuum deposition includes flash evaporation of acrylate-containing monomer, oligomer, or resin with in situ polymerization under vacuum, plasma deposition and polymerization of acrylate-containing monomers, oligomer, or resin, as well as vacuum deposition of the barrier layers by sputtering, chemical vapor deposition, plasma enhanced chemical vapor deposition, evaporation, sublimation, electron cyclotron resonance-plasma enhanced vapor deposition (ECR-PECVD), and combinations thereof.

It is critical to protect the integrity of the barrier layer to avoid the formation of defects and/or microcracks in the deposited layer. The encapsulated OLED is preferably manufactured so that the barrier layers are not directly contacted by any equipment, such as rollers in a web coating system, to avoid defects that may be caused by abrasion over a roll or roller. This can be accomplished by designing the deposition system such that a set of layers of polymer/barrier/polymer are deposited prior to contacting or touching any handling equipment.

The substrate can be flexible or rigid. The flexible substrate may be any flexible material, including, but not limited to, polymers, for example polyethlyene terephthalate (PET), polyethylene naphthalate (PEN), or high temperature polymers such as polyether sulfone (PES), polyimides, or Transphan™ (a high Tg cyclic olefin polymer available from Lofo High Tech Film, GMBH of Weil am Rhein, Germany), metal, paper, fabric, and combinations thereof. The rigid substrate is preferably glass, metal, or silicon. If a flexible, encapsulated OLED is desired and a rigid substrate was used during manufacture, the rigid substrate is preferably removed prior to use.

The polymer layers of the first and second barrier stacks and the polymer layers of the first and second intermediate barrier stacks are preferably acrylate-containing monomer, oligomer or resin, and combinations thereof. The polymer layers of the first and second barrier stacks and first and second intermediate stacks can be the same or they can be different. In addition, the polymer layers within the each barrier stack can be the same or different.

The barrier layers in the barrier stacks and the intermediate barrier stacks may be any barrier material. The barrier materials in the first and second barrier stacks and first and second intermediate barrier stacks can be the same or different. In addition, multiple layers of the same or different barrier layers can be used in a stack. Preferred transparent barrier materials include, but are not limited to, metal oxides, metal nitrides, metal carbides, metal oxynitrides, and combinations thereof. The metal oxides are preferably selected from silica, alumina, titania, indium oxide, tin oxide, indium tin oxide, and combinations thereof, the metal nitrides are preferably selected from aluminum nitride, silicon nitride, and combinations thereof, the metal carbide is preferably silicon carbide, and the metal oxynitride is preferably silicon oxynitride.

Since only one side of the device must be transparent, only one of the barrier layers must be transparent. In this situation, the barrier layer on the opposite side could be an opaque barrier material, including, but not limited to, metal, ceramic or polymer.

Figure 3:
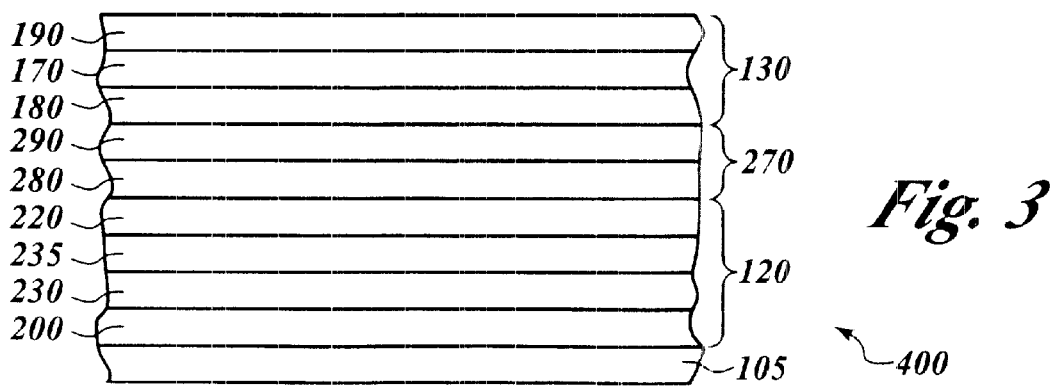
FIG. 3 is a cross-section of an embodiment of an encapsulated OLED of the present invention.

An alternate encapsulated OLED is shown in FIG. 3. The encapsulated OLED 400 has a substrate 105 on which is fabricated an organic light emitting layer stack 120. A barrier stack 130 is deposited conformally over the organic light emitting layer stack 120, encapsulating it. The polymer layers in the barrier stack can be deposited in vacuum or by using atmospheric processes such as spin coating and/or spraying. A preferred method of forming the barrier stack is flash evaporating acrylate-containing monomers, oligomers or resins, condensing on the OLED layer stack, and polymerizing in-situ in a vacuum chamber. The barrier layer is then deposited on the polymer layer using conventional vacuum processes such as evaporation, sputtering, CVD, PECVD or ECR-PECVD. A second polymer layer is then deposited on the barrier layer using the process described above.

Alternatively, the OLED device could also be encapsulated by laminating a lid structure, containing the barrier stack, to the substrate over the organic light emitting layer structure. The lamination can be performed using either adhesive, or glue, or the like, or by heating. The encapsulated OLED could also include an intermediate barrier stack 270 as shown. If the substrate is transparent, then the barrier material could be opaque, or vice versa, as discussed above.

A single pass, roll-to-roll, vacuum deposition of a three layer combination on a PET substrate, i.e., PET substrate/polymer layer/barrier layer/polymer layer, can be more than five orders of magnitude less permeable to oxygen and water vapor than a single oxide layer on PET alone. See J. D. Affinito, M. E. Gross, C. A. Coronado, G. L. Graff, E. N. Greenwell, and P. M. Martin, *Polymer-Oxide Transparent Barrier Layers Produced Using PML Process,* 39th Annual Technical Conference Proceedings of the Society of Vacuum Coaters, Vacuum Web Coating Session, 1996, pages 392–397; J. D. Affinito, S. Eufinger, M. E. Gross, G. L. Graff, and P. M. Martin, *PML/Oxide/PML Barrier Layer Performance Differences Arising From Use of UV or Electron Beam Polymerization of the PML Layers,* Thin Solid Films, Vol.308, 1997, pages 19–25. This is in spite of the fact that the effect on the permeation rate of the polymer multilayers (PML) layers alone, without the barrier layer (oxide, metal, nitride, oxynitride) layer, is barely measurable. It is believed that the improvement in barrier properties is due to two factors. First, permeation rates in the roll-to-roll coated oxide-only layers were found to be conductance limited by defects in the oxide layer that arose during deposition and when the coated substrate was wound up over system idlers/rollers. Asperities (high points) in the underlying substrate are replicated in the deposited inorganic barrier layer. These features are subject to mechanical damage during web handling/take-up, and can lead to the formation of defects in the deposited film. These defects seriously limit the ultimate barrier performance of the films. In the single pass, polymer/barrier/polymer process, the first acrylic layer planarizes the substrate and provides an ideal surface for subsequent deposition of the inorganic barrier thin film. The second polymer layer provides a robust "protective" film that minimizes damage to the barrier layer and also planarizes the structure for subsequent barrier layer (or organic light emitting layer stack) deposition. The intermediate polymer layers also decouple defects that exist in adjacent inorganic barrier layers, thus creating a tortuous path for gas diffusion. The permeability of the barrier stacks used in the present invention is shown below.

TABLE 1

| Sample | Oxygen Permeation Rate (cc/m$^2$/day) | | Water vapor Permeation (g/m$^2$/day)[+] |
|---|---|---|---|
| | 23° C.* | 38° C.[+] | 38° C.[+] |
| 1-barrier stack | <0.005 | <0.005 | 0.46 |
| 2-barier stacks | <0.005 | <0.005 | <0.005 |
| 5-barrier stacks | <0.005 | <0.005 | <0.005 |

*38° C., 90% RH; 100% O$_2$
[+]38° C., 100% RH
NOTE: Permeation rates of <0.005 are below the detection limits of current instrumentation (Mocon OxTran 2/20 L).

As can be seen from the data in Table 1, the barrier stacks used in the present invention provide exceptional environmental protection, which was previously unavailable with polymers. We have also compared the performance of OLED devices (fabricated on glass and silicon) before and after encapsulation using the barrier stacks of the present invention. After encapsulation, the current density-versus-voltage and brightness-versus-current density characteristics were identical (within experimental error) to the measured behavior of the pristine (unencapsulated) devices. This shows that the barrier stacks and deposition methods are compatible with OLED device manufacturing.

Thus, the present invention provides a barrier stack with the exceptional barrier properties necessary for hermetic sealing of an OLED. It permits the production of an encapsulated OLED.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. An encapsulated organic light emitting device comprising:
    a first barrier stack comprising at least one first barrier layer and at least one first polymer layer wherein at least one of the at least one first polymer layers comprises an acrylate-containing polymer;
    an organic light emitting layer stack adjacent to the first barrier stack; and
    a second barrier stack comprising at least one second barrier layer and at least one second polymer layer, the second barrier stack adjacent to the organic light emitting layer stack.

2. The encapsulated organic light emitting device of claim 1 further comprising a substrate adjacent to the first barrier stack on a side opposite to the organic light emitting layer stack.

3. The encapsulated organic light emitting device of claim 2 further comprising at least one first intermediate barrier stack located between the substrate and the first barrier stack, the first intermediate barrier stack comprising at least one third polymer layer and at least one third barrier layer.

4. The encapsulated organic light emitting device of claim 2 wherein the substrate comprises a flexible substrate material.

5. The encapsulated organic light emitting device of claim 4 wherein the flexible substrate material is selected from polymers, metals, paper, fabric, and combinations thereof.

6. The encapsulated organic light emitting device of claim 2 wherein the substrate comprises a rigid substrate material.

7. The encapsulated organic light emitting device of claim 6 wherein the rigid substrate material is selected from glass, metal, and silicon.

8. The encapsulated organic light emitting device of claim 3 wherein at least one of the at least one third polymer layers comprises an acrylate-containing polymer.

9. The encapsulated organic light emitting device of claim 1 further comprising at least one second intermediate barrier stack located between the organic light emitting layer stack and either the first or second barrier stacks, the second intermediate barrier stack comprising at least one fourth polymer layer and at least one fourth barrier layer.

10. The encapsulated organic light emitting device of claim 9 wherein at least one of the at least one fourth polymer layers comprises an acrylate-containing polymer.

11. The encapsulated organic light emitting device of claim 1 wherein the at least one first barrier layer is substantially transparent.

12. The encapsulated organic light emitting device of claim 1 wherein the at least one second barrier layer is substantially transparent.

13. The encapsulated organic light emitting device of claim 1 wherein at least one of the at least one first and second barrier layers comprise a material selected from metal oxides, metal nitrides, metal carbides, metal oxynitrides, and combinations thereof.

14. The encapsulated organic light emitting device of claim 13 wherein the metal oxides are selected from silica, alumina, titania, indium oxide, tin oxide, indium tin oxide, and combinations thereof.

15. The encapsulated organic light emitting device of claim 13 wherein the metal nitrides are selected from aluminum nitride, silicon nitride, and combinations thereof.

16. The encapsulated organic light emitting device of claim 1 wherein the at least one first barrier layer is substantially opaque.

17. The encapsulated organic light emitting device of claim 1 wherein the at least one second barrier layer is substantially opaque.

18. The encapsulated organic light emitting device of claim 1 wherein at least one of the at least one first and second barrier layers is selected from opaque metals, opaque polymers, and opaque ceramics.

19. The encapsulated organic light emitting device of claim 1 wherein at least one of the at least one second polymer layers comprises an acrylate-containing polymer.

20. The encapsulated organic light emitting device of claim 1 wherein the organic light emitting layer stack comprises a first electrode, an electroluminescent layer, and a second electrode.

21. The encapsulated organic light emitting device of claim 20 wherein the electroluminescent layer comprises a hole transporting layer, and an electron transporting layer.

22. An encapsulated organic light emitting device comprising:
    a first intermediate barrier stack comprising at least one polymer layer and at least one barrier layer;
    a first barrier stack comprising at least one first barrier layer and at least one first polymer layer adjacent to the first intermediate barrier stack;
    an organic light emitting layer stack adjacent to the first barrier stack;
    a second intermediate barrier stack comprising at least one polymer layer and at least one barrier layer, the second intermediate barrier stack adjacent to the organic light emitting layer stack; and
    a second barrier stack comprising at least one second barrier layer and at least one second polymer layer, the second barrier stack adjacent to the second intermediate barrier stack wherein at least one of the polymer layers in the first intermediate barrier stack, the first barrier stack, the second intermediate barrier stack, or the second barrier stack comprises an acrylate-containing polymer.

23. The encapsulated organic light emitting device of claim 22 further comprising a substrate adjacent to the first intermediate barrier stack on a side opposite to the first barrier stack.

24. An encapsulated organic light emitting device comprising:
    a substrate;
    an organic light emitting layer stack adjacent to the substrate;
    a barrier stack comprising at least one barrier layer and at least one polymer layer, the barrier stack adjacent to the organic light emitting layer stack wherein at least one of the at least one polymer layers comprises an acrylate-containing polymer.

25. The encapsulated organic light emitting device of claim 24 further comprising an intermediate barrier stack located between the organic light emitting layer stack and the barrier stack, the intermediate barrier stack comprising at least one polymer layer and at least one barrier layer.

26. The encapsulated organic light emitting device of claim 24 wherein the at least one barrier stack is substantially transparent.

27. The encapsulated organic light emitting device of claim 24 wherein the at least one barrier layer comprises a material selected from metal oxides, metal nitrides, metal carbides, metal oxynitrides, and combinations thereof.

28. The encapsulated organic light emitting device of claim 27 wherein the metal oxides are selected from silica, alumina, titania, indium oxide, tin oxide, indium tin oxide, and combinations thereof.

29. The encapsulated organic light emitting device of claim 27 wherein the metal nitrides are selected from aluminum nitride, silicon nitride, and combinations thereof.

30. The encapsulated organic light emitting device of claim 24 wherein the at least one barrier layer is substantially opaque.

31. The encapsulated organic light emitting device of claim 24 wherein the at least one barrier layer is selected from opaque metals, opaque polymers, and opaque ceramics.

32. The encapsulated organic light emitting device of claim 24 wherein the substrate comprises a rigid substrate material.

33. The encapsulated organic light emitting device of claim 32 wherein the rigid substrate material is selected from glass, metal, and silicon.

34. The encapsulated organic light emitting device of claim 24 wherein the substrate comprises a flexible substrate material.

35. The encapsulated organic light emitting device of claim 34 wherein the flexible substrate material is selected from polymers, metals, paper, fabric, and combinations thereof.

36. An encapsulated organic light emitting device comprising:
   a first barrier stack comprising at least one first barrier layer and at least one first polymer layer;
   an organic light emitting layer stack adjacent to the first barrier stack; and a second barrier stack comprising at least one second barrier layer and at least one second polymer layer, the second barrier stack adjacent to the organic light emitting layer stack wherein at least one of the at least one second polymer layers comprises an acrylate-containing polymer.

37. The encapsulated organic light emitting device of claim 36 further comprising a substrate adjacent to the first barrier stack on a side opposite to the organic light emitting layer stack.

38. The encapsulated organic light emitting device of claim 37 further comprising at least one first intermediate barrier stack located between the substrate and the first barrier stack, the first intermediate barrier stack comprising at least one third polymer layer and at least one third barrier layer.

39. The encapsulated organic light emitting device of claim 36 further comprising at least one second intermediate barrier stack located between the organic light emitting layer stack and either the first or second barrier stacks, the second intermediate barrier stack comprising at least one fourth polymer layer and at least one fourth barrier layer.

40. The encapsulated organic light emitting device of claim 36 wherein the at least one first barrier layer is substantially transparent.

41. The encapsulated organic light emitting device of claim 36 wherein the at least one second barrier layer is substantially transparent.

42. The encapsulated organic light emitting device of claim 36 wherein at least one of the at least one first and second barrier layers comprise a material selected from metal oxides, metal nitrides, metal carbides, metal oxynitrides, and combinations thereof.

43. The encapsulated organic light emitting device of claim 42 wherein the metal oxides are selected from silica, alumina, titania, indium oxide, tin oxide, indium tin oxide, and combinations thereof.

44. The encapsulated organic light emitting device of claim 42 wherein the metal nitrides are selected from aluminum nitride, silicon nitride, and combinations thereof.

45. The encapsulated organic light emitting device of claim 36 wherein the at least one first barrier layer is substantially opaque.

46. The encapsulated organic light emitting device of claim 36 wherein the at least one second barrier layer is substantially opaque.

47. The encapsulated organic light emitting device of claim 36 wherein at least one of the at least one first and second barrier layers is selected from opaque metals, opaque polymers, and opaque ceramics.

48. The encapsulated organic light emitting device of claim 37 wherein the substrate comprises a flexible substrate material.

49. The encapsulated organic light emitting device of claim 48 wherein the flexible substrate material is selected from polymers, metals, paper, fabric, and combinations thereof.

50. The encapsulated organic light emitting device of claim 37 wherein the substrate comprises a rigid substrate material.

51. The encapsulated organic light emitting device of claim 50 wherein the rigid substrate material is selected from glass, metal, and silicon.

52. The encapsulated organic light emitting device of claim 36 wherein at least one of the at least one first polymer layers comprises an acrylate-containing polymer.

53. The encapsulated organic light emitting device of claim 38 wherein at least one of the at least one third polymer layers comprises an acrylate-containing polymer.

54. The encapsulated organic light emitting device of claim 39 wherein at least one of the at least one fourth polymer layers comprises an acrylate-containing polymer.

55. The encapsulated organic light emitting device of claim 36 wherein the organic light emitting layer stack comprises a first electrode, an electroluminescent layer, and a second electrode.

56. The encapsulated organic light emitting device of claim 55 wherein the electroluminescent layer comprises a hole transporting layer, and an electron transporting layer.

57. An encapsulated organic light emitting device comprising:
   a first barrier stack comprising at least one first barrier layer and at least one first polymer layer;
   an organic light emitting layer stack adjacent to the first barrier stack; and a second barrier stack comprising at least one second barrier layer and at least one second polymer layer, the second barrier stack adjacent to the organic light emitting layer stack wherein the at least one first barrier layer is substantially transparent.

* * * * *